United States Patent
Sakurai et al.

(10) Patent No.: US 9,293,175 B2
(45) Date of Patent: Mar. 22, 2016

(54) SEMICONDUCTOR MEMORY AND VOLTAGE OUTPUT MEASURING METHOD OF THE SEMICONDUCTOR MEMORY

(75) Inventors: Katsuaki Sakurai, Kanagawa-ken (JP); Yoshihisa Iwata, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 228 days.

(21) Appl. No.: 13/607,493

(22) Filed: Sep. 7, 2012

(65) Prior Publication Data
US 2013/0250702 A1    Sep. 26, 2013

(30) Foreign Application Priority Data
Mar. 23, 2012   (JP) .................................. 2012-067942

(51) Int. Cl.
*G11C 16/30* (2006.01)
*G11C 5/14* (2006.01)

(52) U.S. Cl.
CPC ................ *G11C 5/147* (2013.01); *G11C 16/30* (2013.01)

(58) Field of Classification Search
CPC ................................. G11C 16/30; G11C 5/147
USPC ........................................ 365/189.09, 189.11
See application file for complete search history.

(56) References Cited

U.S. PATENT DOCUMENTS

| | | | |
|---|---|---|---|
| 7,233,462 B2 * | 6/2007 | Kanakubo | ....................... 361/18 |
| 2002/0018369 A1 | 2/2002 | Ogura | |
| 2003/0128489 A1 * | 7/2003 | Katoh et al. | ................. 361/93.9 |
| 2005/0036246 A1 * | 2/2005 | Nagata et al. | .................... 361/18 |
| 2007/0008779 A1 | 1/2007 | Isobe | |
| 2010/0128551 A1 * | 5/2010 | Tanzawa et al. | .............. 365/226 |
| 2010/0232233 A1 | 9/2010 | Futatsuyama et al. | |
| 2010/0277977 A1 | 11/2010 | Nakamura | |
| 2010/0329026 A1 | 12/2010 | Nakamura et al. | |
| 2013/0148405 A1 * | 6/2013 | Kang et al. | ..................... 365/148 |
| 2013/0154605 A1 * | 6/2013 | Nagata et al. | ................. 323/313 |

FOREIGN PATENT DOCUMENTS

| | | |
|---|---|---|
| JP | H09-204773 A | 8/1997 |
| JP | 2002-015590 A | 1/2002 |
| JP | 2007-080306 A | 3/2007 |
| JP | 2010-098050 A | 4/2010 |
| JP | 2011-028827 | 2/2011 |
| JP | 2011-053957 A | 3/2011 |

OTHER PUBLICATIONS

Japanese Office Action dated Apr. 22, 2014 in counterpart Japanese Patent Application No. 2012-067942, with English Translation (19 pages).

* cited by examiner

*Primary Examiner* — Douglas King
(74) *Attorney, Agent, or Firm* — Patterson & Sheridan, LLP (57) ABSTRACT

A semiconductor memory device includes a first comparative device, to which first and second voltages are input; a first capacitor, which accumulates the electrical potential of a first node; a power source, which outputs the first electric current to a second node; a resistor, which generates a third voltage in the second node; a second capacitor, which accumulates the electric potential of the second node; first switches, which make a common connection at a third node possible for the first node and the second node, to which the first capacitor and the second capacitor are connected respectively; and a second comparison device, which uses as an input voltage a fourth voltage, which is obtained as a result of the charge share between the first and the second capacitors and the electrical potential of a fourth node, and equalizes the electrical potential of the fourth node with the fourth voltage.

6 Claims, 9 Drawing Sheets

VOLTAGE GENERATOR CIRCUIT 71

SEMICONDUCTOR MEMORY AND VOLTAGE OUTPUT MEASURING METHOD OF THE SEMICONDUCTOR MEMORY

CROSS-REFERENCE TO RELATED APPLICATION

This application is based upon and claims the benefit of priority from Japanese Patent Application No. 2012-067942, filed Mar. 23, 2012; the entire contents of which are incorporated herein by reference.

FIELD

Embodiments described herein relate to a semiconductor memory in which a level-shifted voltage is less affected by thermal variability.

BACKGROUND

In recent years, a layered semiconductor memory with memory function (BiCS: Bit Cost Scalable Flash Memory) has been developed. BiCS can embody large-capacity semiconductor memories at low cost. However, BiCS relies on voltage shifting in a manner that is affected by thermal conditions and increased circuit size is required to moderate or compensate for the thermal effects.

DETAILED DESCRIPTION

In general, the embodiments of this disclosure will be explained using the included figures. In this explanation, same reference notations will be used to refer to common parts in all the illustrations.

According to a first embodiment, there is provided a semiconductor memory that provides an unselected source line SL with stable voltage by reducing the thermal effects on the level-shifted voltage.

The semiconductor memory according to the embodiment includes a first comparison device, which uses as a first voltage and a second voltage of a first node as input voltages, subjected to the electric potential detection, and equalizes the second voltage with the first voltage; a first capacitor, which accumulates the electric potential of the first node; a current source, which outputs a first current to a second node; a resistor, which generates a third voltage at this second node; a second capacitor, which accumulates electric potential of the second node; a first switch, which makes a common connection at the third node possible for the first and second nodes, to which the first capacitor and the second capacitor are connected respectively; a fourth voltage, which is obtained as a result of the charge shared between the first capacitor and the second capacitor; and a second comparison device, which uses as input voltage the electric potential of the fourth node, whose electric potential is halved at its output terminal, and equalizes the electric potential of the fourth node with the fourth voltage.

Also, the voltage output measuring method of the semiconductor memory according to an embodiment has a step in which the first voltage is compared with the second voltage of the first node, which is considered as the detected electric potential, and the second voltage is equalized with the first voltage; a step in which the electric potential of the second node is made to be the third voltage by outputting the first current to the resistor, whose one terminal is connected to the second node; a step in which the first voltage and the third voltage are accumulated at the first and the second capacitors respectively by connecting the first node and the second node to their corresponding first capacitor and the second capacitor; and a step in which the fourth voltage at this third node, which is obtained by connecting the first and the second capacitors in series through the third node, is equalized with the fifth voltage, subjected to the detection of this fourth voltage.

Embodiment 1

The semiconductor memory according to this embodiment makes it possible to provide an unselected source line SL with a stable voltage by reducing the thermal effects on the level-shifted voltage.

1. Entire Construction

Figure 1:
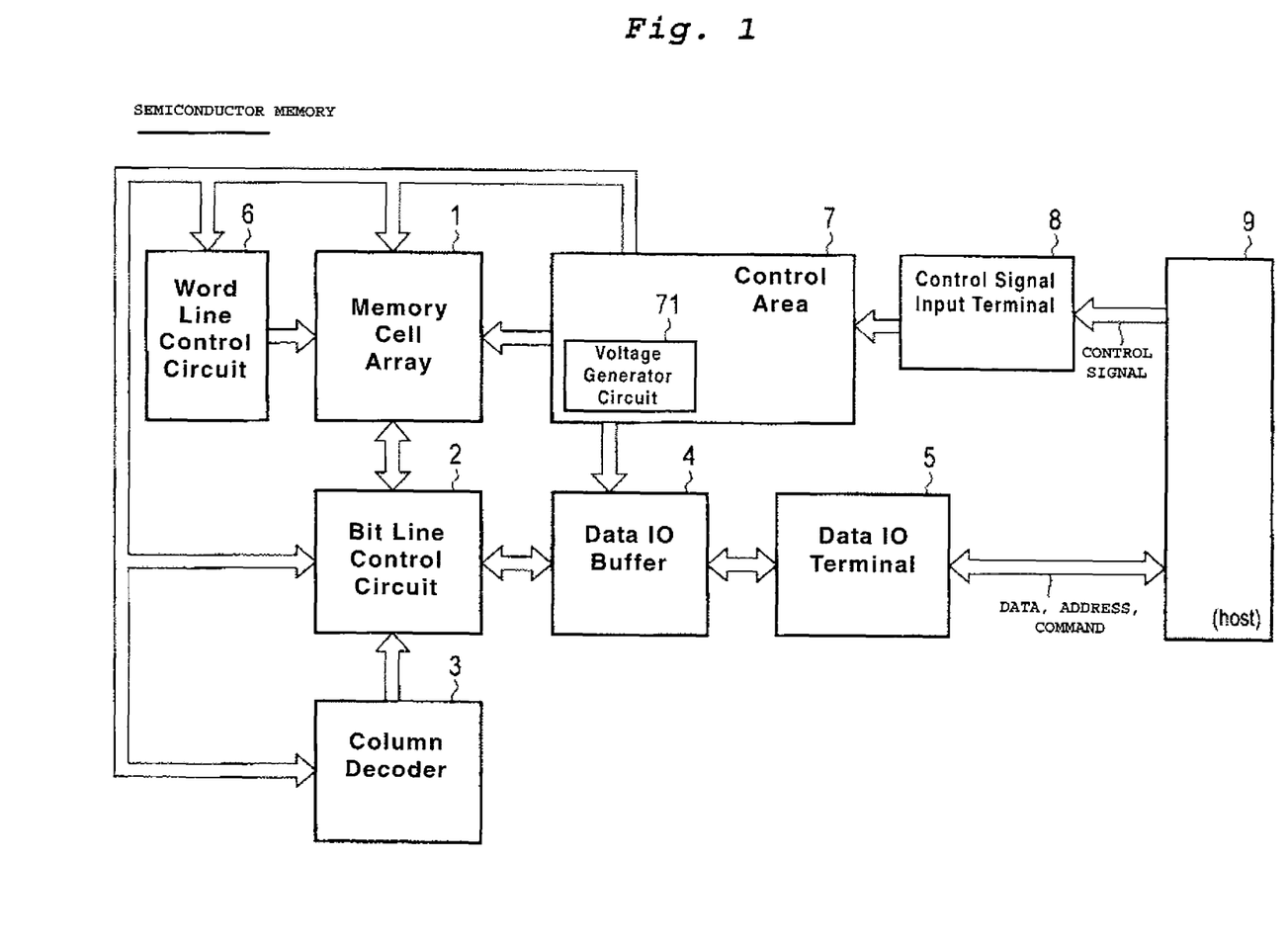
FIG. 1 is an illustration of the entire layout of a semiconductor memory according to a first embodiment.

As shown in FIG. 1, the semiconductor memory of this embodiment is equipped with a memory cell array 1, a bit line control circuit 2, a column decoder 3, a data input/output buffer 4, a data input/output terminal 5, a word line control circuit 6, a control area 7, a control signal input terminal 8, and a host 9 (host, for example an external memory controller for controlling a semiconductor chip). In this embodiment, the control area 7 has a voltage-generator circuit 71.

The memory cell array 1 has a non-volatile memory cell MC, which is placed vertically (also called longitudinally) against the semiconductor substrate in multiple layers. This memory cell MC is a D (depression)-type MOS transistor, which is equipped with, for example, charge-storage layers, block layers, and a layer gate including a control gate. In other words, the memory cell MC is formed without source/drain. The selected transistors ST1 and ST2, which will be mentioned later, have the same structure as the memory cell MC, except that they have no charge storage layers nor block layers.

Here, the construction of the memory cell MC does not have to be a D-type MOS transistor. In other words, the memory cell MC and the selected transistors ST1 and ST2 can be n-channel type MOS transistors with source/drain. In this case, the control gate of the memory cell MC is connected to the word line, the drain is connected electrically to the bit line BL, and the source is connected electrically to the source line SL (in the following, the control circuit 22 on the source side.)

During data write operations, the bit line control circuit 2 writes data in the memory cell MC by transmitting the data from the data input/output buffer 4 to the bit line BL. During read operations, the data read out from the bit line, which is selected by the column decoder 3, is sensed and amplified, and is transmitted to the data input/output buffer 4.

The column decoder 3 selects the column direction of the memory cell 1, according to the column address given by the control area 7.

The data input/output buffer 4 temporarily holds the written data, addresses and commands which are received at the data input/output terminal 5. Then, it outputs the written data to the bit control circuit 2, and outputs the addresses and commands to the control area 7. Also, through the data input/output terminal 5, it outputs data, which is received from the bit line control circuit 2, to the host 9.

The data input/output terminal 5 outputs written data, addresses and commands, which are provided by the host 9, to the data input/output buffer 4. Also, it outputs data to the host 9.

The word line control circuit 6 selects the row direction of the memory cell array 1. In other words, according to the row addresses given by the control area 7, it selects either of the word lines WL, and applies a voltage to the selected word line WL. The applied voltage will be discussed later.

The control area 7 controls the entire operation of the memory cell array 1. In other words, based on the control signals received by the control signal input terminal 8, and the commands and addresses received by the data input/output buffer 4, it executes the write operation and read operation of data, and an erase operation. In order to execute this sequence, it controls the operations of each circuit block within the semiconductor memory.

As shown in FIG. 1, the control area 7 includes a voltage-generator circuit 71. The voltage-generator circuit 71 generates voltages necessary for the write operation, read operation, and erase operation (voltage VPMG, voltage VPASS, voltage VCGR, voltage VREAD, and voltage VERA.) In addition, it generates voltages to operate the semiconductor memory in this embodiment (for example, voltage VSUP at a predetermined voltage level) by receiving a voltage (from this point on, the voltage given to the selected source line is called $V_{SL}$, and the voltage given to the unselected line is called $V_{USL}$) which is provided to the selected source line SL and unselected source line SL during the read and write operations of data; and an external voltage (for example, voltage VCC) from the host 9. Also, the voltage-generator circuit 71 can output the external voltage directly as the voltage to operate the semiconductor memory in this embodiment.

The control signal input terminal 8 receives signals from the host 9 and provides the control area 7 with them.

The host 9 provides the control signal input terminal 8 with control signals, and provides the data input/output terminal 5 with data, addresses and commands. Also, the host 9 provides the voltage-generator circuit 71 with an external voltage.

The voltage VPGM defines a voltage applied to the selected word line WL so that an electric charge is injected to the electrical-charge accumulation layer to transition the memory cell MC into another state during the write operation.

The voltage VPASS is a voltage that is applied to the unselected word line WL during a write operation, and puts the memory cell transistor MT into an on state.

The voltage VCGR is a voltage that is applied to the selected word line WL during read operation. The voltage VREAD is a voltage that is applied to unselected word line WL during read operation. The memory cell MC stays on, when VREAD is applied to the un-selected word line WL during the read operation.

The voltage VERA is a voltage that is applied to a semiconductor layer SC (as will hereinafter be described in detail) during the erase operation and is, for example, 20 volts. Also, $V_{SL}$ is provided to the source line SL, which is connected to the memory string which includes the selected memory cell MC. To the other source lines SL which are connected to the memory string, $V_{USL}$ is provided. Further, this $V_{USL}$, given to the unselected memory string, is set to be bigger than the voltage that control circuit 2 gives to the bit line BL. This is to prevent the semiconductor substrate that forms the memory cell MC (a semiconductor layer SC) from conducting, because it is necessary to make the memory string unselected.

The control signal input terminal 8 provides the control area 7 with control signals, provided by the host 9. Some examples of control signals are the write enable signal, which controls the write operation, and the chip enable signal, which is used to make the operation effective by the un-volatile memory 3 itself.

2. Detail of Memory Cell Array 1 and Peripheral Circuit Thereof

Figure 2:
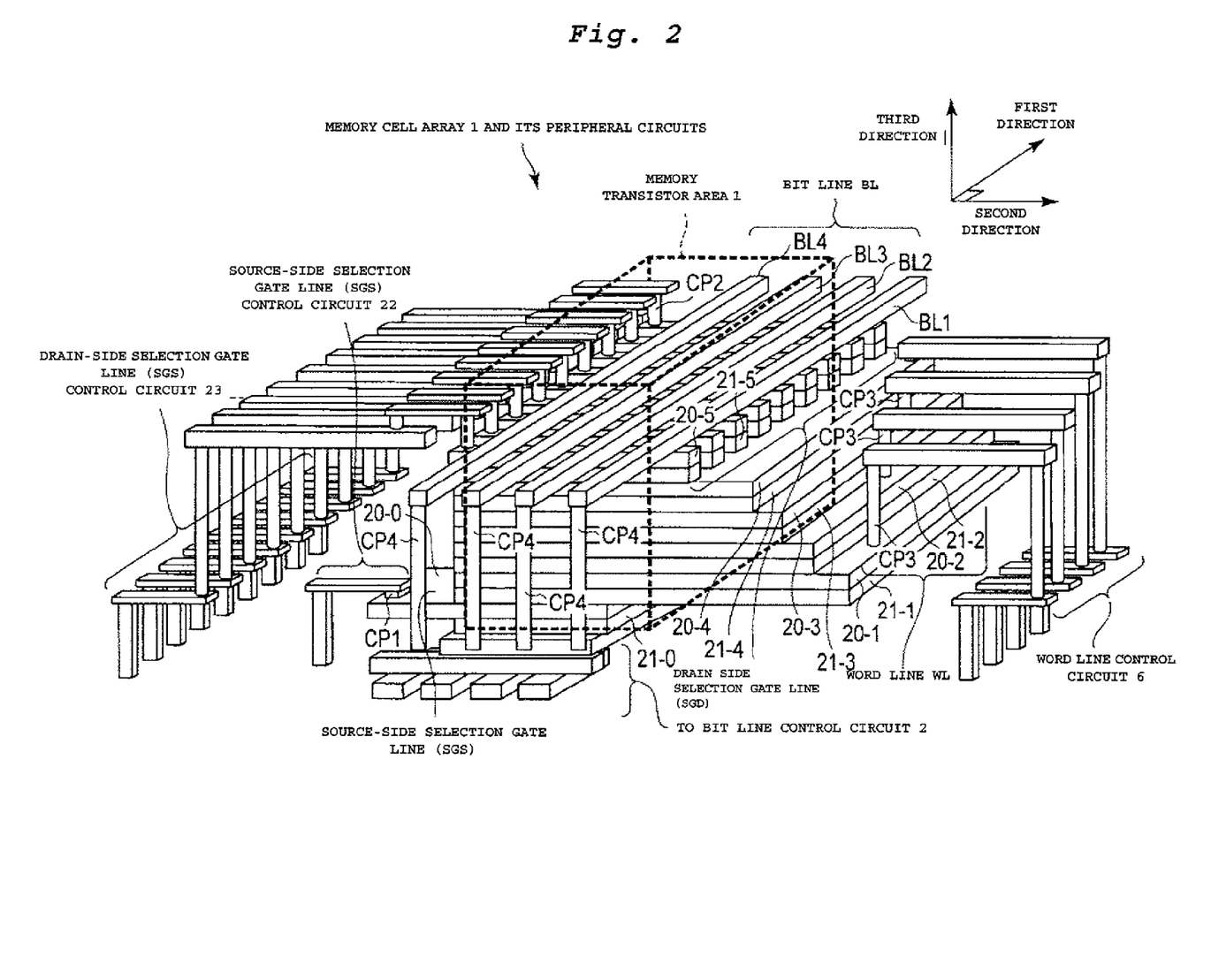
FIG. 2 is a detailed illustration of the configuration of a memory cell array and its neighboring circuits according to the first embodiment.

The construction of the memory cell array 1 and its peripheral circuits, mentioned-above, will be explained using detailed FIG. 2. FIG. 2 shows the memory cell array 1 and its peripheral circuits in a perspective drawing. As shown in FIG. 2, flat conduction layers 20-1 through 20-4, which function as the word lines WL, and the insulation layers 21-1 through 21-4, each of which is located over each flat conduction layer, are disposed in a plane formed by the first direction and the second direction. Each of the conduction layers 20-1 through 20-4 functions as the control gate for the memory cell MC, which is described later. CG1 (20-1) is the control gate for word line WL1, while CG4 (20-4) is the control gate for word line WL4, etc. As shown in FIG. 2, the conduction layers 20-1 through 20-4 and insulation layers 21-1 through 21-4 are laminated alternately so that the conduction layers 20-1 through 20-4 are electrically separated.

To simplify the explanation here, the construction in which four sets of the conduction and insulation layers are laminated has been explained. However, the number of sets of conduction and insulation layers that are laminated is not limited to this number. Also, in this disclosure, in cases for which it is not necessary to distinguish between the conduction layers 20-1 through 20-4, or insulation layers 21-1 through 21-4, they will be referred to as conduction layer 20 or insulation layer 21.

Also, the conduction layers 20-1 through 20-4 are electrically connected to the word line control circuit 6 through the contact plug CP3, which is electrically connected to each surface thereof. In other words, the word line control circuit 6 generates a voltage corresponding to selection or un-selection of the word lines WL1 through WL4, during write operation and read operation, and applies the generated voltage to the word line WL 1 through WL 4.

Under the insulation layer 21-1, the flat conduction layer 20-0 is placed. The flat conduction layer 20-0 functions as a source-side selection gate line (SGS). To this source selection gate line SGS, a control circuit 22, which controls the source-side selection gate line SGS to be ON or OFF through the contact plug CP1, is connected. This control circuit 22 applies a voltage (for example 0 V) to the source-side selection gate line SGS, in order to cause the source-side selection gate line SGS to be in the corresponding condition.

Also, over the conduction layer 20-4, the conduction layer 20-5 is formed so as to extend lengthwise in the first direction and second directions, and with the insulation layer 21-5 in between the conduction layer 20-4 and the conduction layer 20-5. The conduction layer 20-5 functions as a drain-side selection gate line SGD. To this drain-side selection gate line SGD, the control circuit 23, which controls the drain-side selection gate line SGD through the contact plug CP2, is connected. This control circuit 23 applies a voltage (for example, 0 V) to this drain-side selection gate line SGD the drain-side selection gate line SGD is in the selected condition.

Also, multiple bit lines BLs, extending in the first direction, are formed above the conduction layer 20-5. One end of the bit line BL is connected to the bit line control circuit 2, through the contact plug CP4. Here, for convenience, FIG. 2 shows only the bit lines BL1 through BL4, but there is no limit to the number of bit lines BL that may be formed. For example, 128 bit lines (BL1 through BL128) can be formed.

3. The Details of the Memory Cell MC

Figure 3:
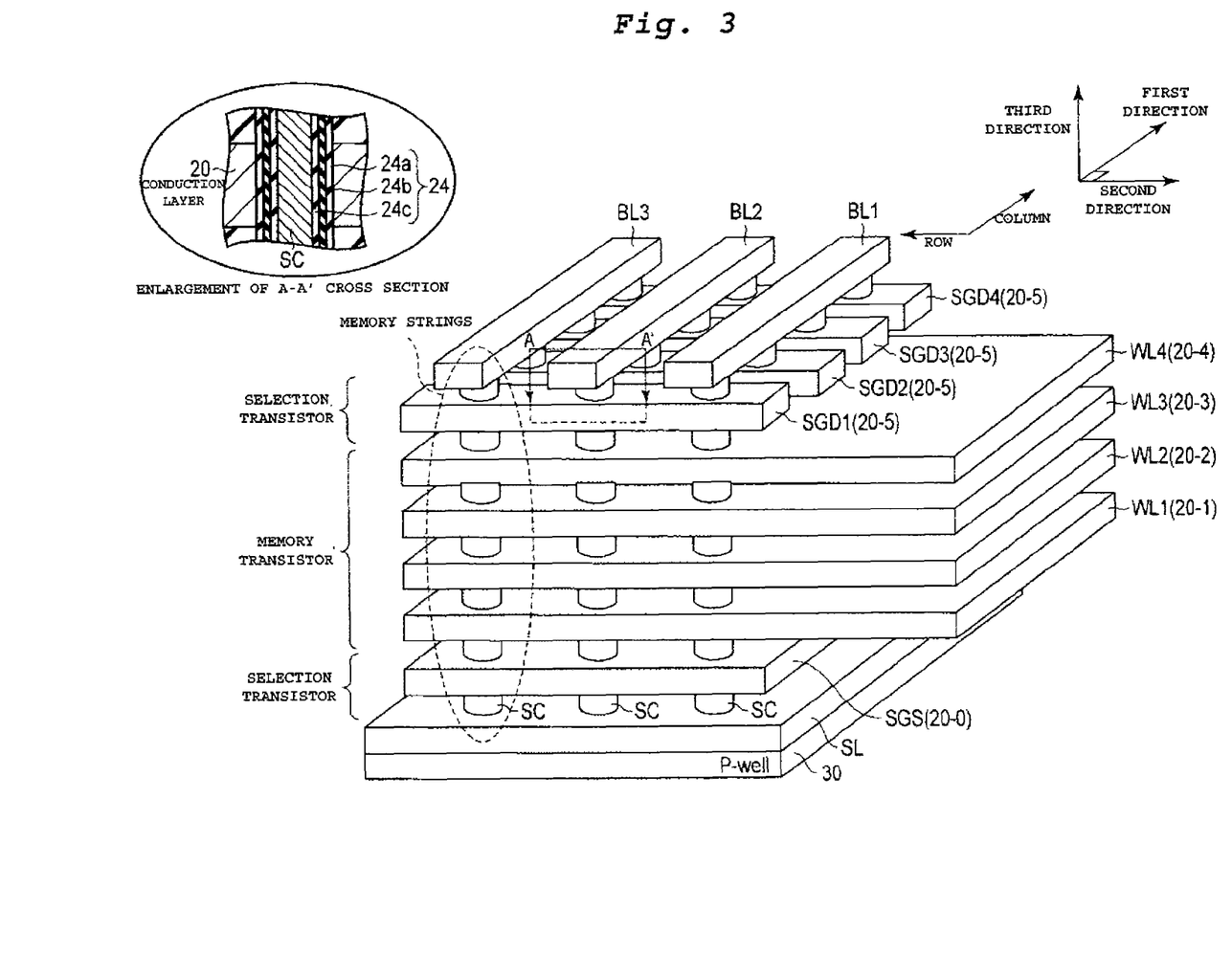
FIG. 3 is an illustration that shows the configuration of a memory cell MC in the memory cell array according to the first embodiment.

Next, using FIG. 3, the detailed structure of the memory cell MC will be explained using the enlarged depiction of the memory cell array 1. Here, for ease of visibility, the figure omits the insulation layers 21-0 through 21-5, which electrically separate each of the conduction layers 20-0 through 20-5. We will demonstrate, as one example, a case in which four memory strings are formed below each of the three rows of bit lines BL, and the four layers of word lines WL are laminated. As shown in FIG. 3, on semiconductor substrate 30 (p-well), a conducting layer (in the illustration, denoted as SL) is formed. A semiconductor layer SC is formed at several locations. One end of each semiconductor layer SC is connected to the conducting layer (SL), and passes through the conducting layers 20-0 through the conducting layers 20-5, while the other end is connected to one of the bit lines BL. Around the semiconductor layer SC, a gate insulation film, an electric charge accumulation layer and a block layer are formed. In other words, the memory cell MC is formed in the part which corresponds to the intersections of the semiconductor layer SC with the conduction layers 20-1 through 20-5. In this way, a memory string is formed. FIG. 3 shows its enlarged picture.

As shown in the enlarged cross-sectional illustration in the top left-hand corner of FIG. 3, a gate oxidization film 24c, an electric charge accumulation layer 24b, and a block layer 24a are formed in this order on the surface of the semiconductor layer SC. Furthermore, a conducting layer 20 is formed to overlay block layer 24a.

FIG. 3 depicts one example of a memory string on the semiconductor layer SC that is formed between the bit line BL3 and the semiconductor substrate 30. In this case, multiple memory strings are formed in a matrix-wise manner on the plane formed by the first and the second directions.

4. On the Threshold Value of Memory Cell MC

Figure 4:
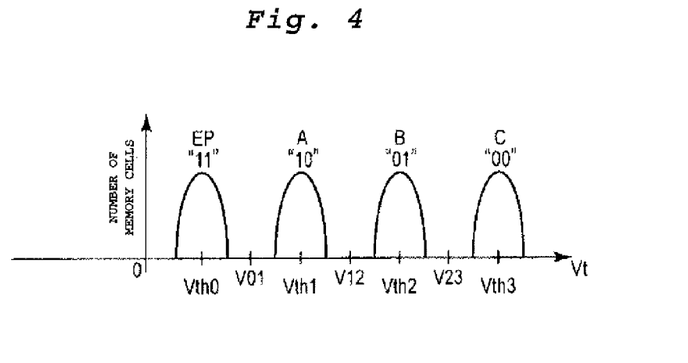
FIG. 4 is a threshold value distribution graph of the memory cell MC of the first embodiment.

Next, using FIG. 4, the threshold value distribution of the memory cell MC will be explained. FIG. 4 is a graph which shows the threshold values distribution in a horizontal axis and the number of memory cells in a vertical axis.

As shown in the illustration, each memory cell MC, for example, can hold data at 4-levels (2 bit data; for example four kinds of data, from the lowest to the highest threshold value voltages Vth, "11", "10", "01" and "00")

The threshold value voltage Vth0 for the datum "11" at the memory cell MC corresponds to an erase state (see EP in the illustration), when 0 V<Vth0<V01. In other words, in this embodiment the erase state in memory cell MC is located on the positive side. The reasons for placing the erase state on the positive side are provided below.

The memory cell MC, which is connected in series, is configured with a sequence of electric charge accumulation layers. As such, when the threshold value voltage in an electric charge accumulation layer of one of the memory cells is negative and the threshold value voltage in an electric charge accumulation layer of an adjacent memory cell is positive, with passage of time, there will be a canceling of electric charges between the adjacent electric charge accumulation layers. As a result, the data in the memory cells would be lost. To prevent such cases, the threshold value voltage of the erase state are shifted to positive even the erase state. In addition, the memory cell MC can also be set to hold data with a value greater than 8.

5. Detail of voltage-generator circuit 71

As mentioned above regarding the details of the voltage-generator circuit 71, the voltage generator circuit 71 generates voltages corresponding to the write operation, read operation and erase operation. In addition, it generates voltages which are provided to the unselected source lines SL and the selected source lines SL during write operation and read operation as mentioned above. In the following, the voltages $V_{SL}$ and $V_{USL}$, which are provided to the selected source lines SL and the unselected source lines SL during the read operation, will be explained with reference to FIG. 5.

Figure 5:
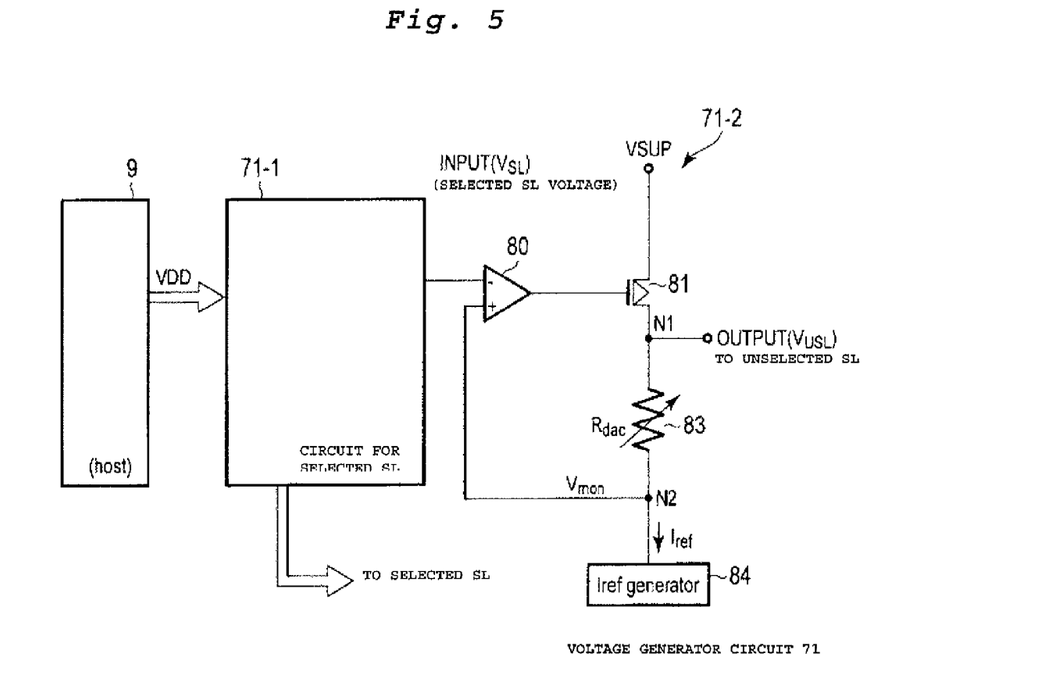
FIG. 5 is a circuit diagram of the voltage-generator circuit of the first embodiment.

As shown in FIG. 5, the voltage generator circuit 71 has a voltage generator circuit for the selected source line 71-1, and a voltage generator circuit for the unselected source line 71-2. The voltage generator circuit for the selected source line 71-1 generates the voltage $V_{SL}$, and provides the selected source line SL with it. The voltage generator circuit for the unselected source line 71-2 generates the voltage $V_{USL}$, and provides the unselected source line SL with it. In the following, the voltage generator circuit for the selected source line 71-1 will be called simply the voltage generation circuit 71-1, and the voltage generator circuit for the unselected source line 71-2 will be called the voltage generator circuit 71-2.

Voltage Generator Circuit 71-1

The Voltage generator circuit 71-1 receives an external voltage (for example, voltage VDD) from host 9, and, based on this voltage, generates the voltage $V_{SL}$ to provide the selected source line SL. The voltage generator circuit 71-1 also provides the voltage generator circuit 71-2 with this $V_{SL}$.

Voltage Generator Circuit 71-2

The voltage generator circuit 71-2 receives the voltage $V_{SL}$, and, based on it, generates the voltage $V_{USL}$ to be provided to the unselected source line SL.

In the following, the circuit map of the voltage generator circuit 71-2 will be explained. As shown in FIG. 5, the voltage generator circuit 71-2 has an operational amplifier 80, a p-channel type MOS transistor 81, a variable resistor 83, and a reference current ($I_{ref}$) generator 84.

As shown in FIG. 5, the voltage VSUP is provided to one end of the current path of the MOS transistor 81. The other end of the path is connected to the node N1. The output from the operational amplifier 80 is supplied to the gate of the MOS transistor 81. The node N1 is the output terminal at which $V_{USL}$ is provided. The end of variable resistor 83 opposite N1 is connected to the node N2 and the $I_{ref}$ generator 84. The electric potential of the node N2 is denoted as $V_{mon}$. $I_{ref}$ flows through variable resistor 83. Details of $I_{ref}$ will be described later. Here, the resistance value of the variable resistor 83 is denoted as $R_{dac}$.

The electric potential at the node N2, namely the voltage $V_{mon}$, is provided to the positive input terminal of the operational amplifier 80. At the reverse input terminal, the voltage $V_{SL}$ from the voltage generator circuit 71-1 is provided. The operational amplifier 80 compares these voltages $V_{mon}$ and voltage $V_{SL}$, and operates to adjust $V_{mon}$ so as to equalize the voltage $V_{mon}$ with the voltage $V_{SL}$. This means that when $V_{SL} > V_{mon}$, the operational amplifier 80 puts the MOS transistor 81 into the ON state by outputting a low voltage "L," which increases $V_{mon}$ at node N2, and brings the electric potential of the voltage $V_{mon}$ closer to the voltage $V_{SL}$. On the other hand, when $V_{SL} < V_{mon}$, the operational amplifier 80 puts the MOS transistor 81 into the OFF state by outputting a high voltage ("H"), which decreases $V_{mon}$ of the node N2, and brings the electric potential of the voltage $V_{mon}$ closer to the voltage $V_{SL}$.

Here and in the descriptions provide below, causing the ON state of the MOS transistor 81 does not mean that the output current of the operational amplifier 80 is 0, but that the output current of the operational amplifier 80 is reduced.

5-1 The Construction of the $I_{ref}$ Generator 84 (No. 1)

Figure 6:
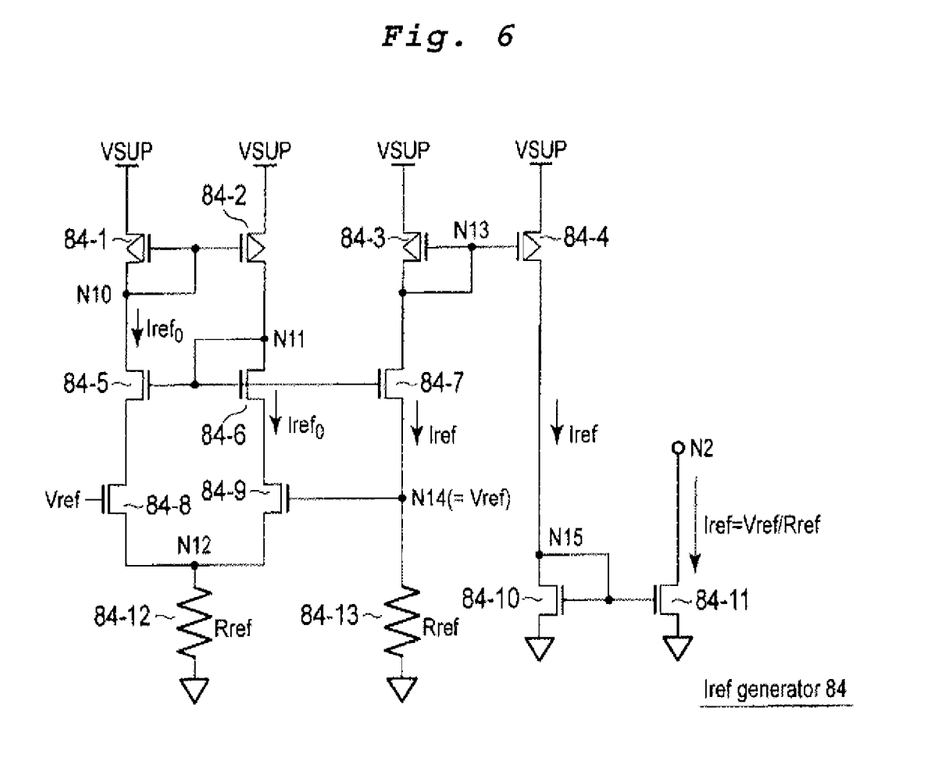
FIG. 6 is a circuit diagram of the reference current generator of the first embodiment.
Figure 7:
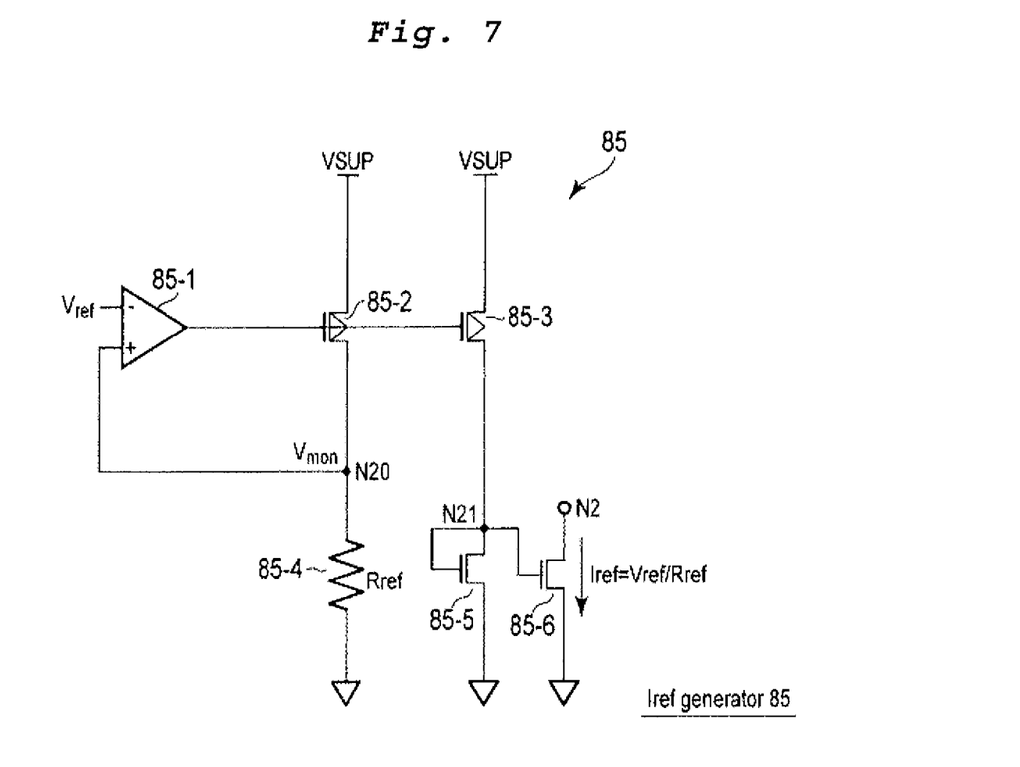
FIG. 7 is a circuit diagram of the reference current generator of the first embodiment.

Next, several unique configurations of the $I_{ref}$ generator 84 will be explained, using FIG. 6 through FIG. 8. First, using FIG. 6, a first configuration of the $I_{ref}$ generator 84 will be explained. As shown in FIG. 6, the $I_{ref}$ generator 84 has p-channel type MOS transistors 84-1 through 84-4, n-channel type MOS transistors 84-5 through 84-11, and resistors 84-12 and 84-13.

As shown in FIG. 6, at one end of the current path of the MOS transistor 84-1, the voltage VSUP is provided. Both the other end of the current path and the gate of the transistor are connected to the node N10.

At one end of the current path through the MOS transistor 84-2, the voltage VSUP is provided. To the other end, the node N11 is connected. The gate of the MOS transistors 84-2 is connected to the node N10. Here, the current flowing at the node N10 is denoted as $I_{ref0}$.

One end of the current path through the MOS transistor 84-5 is connected to the MOS transistor 84-1 at the node N10. The other end of the current path is connected to one end of the current path through the MOS transistor 84-8. The node N11 is connected to the gate of MOS transistor 84-5.

One end of the current path through the MOS transistor 84-6 is connected to node N11, and the other end is connected to one end of the current path through the MOS transistor 84-9. The gate of transistor 84-6 is connected to the node N11. Also, the gate of the MOS transistor 84-6 is connected to the gate of the MOS transistor 84-5 at node N11. These MOS transistors 84-5 and 84-6 form a Miller circuit. Consequently, $I_{ref0}$ also flows to the MOS transistors 84-5 and 85-6.

The other end of the current path of the MOS transistor 84-8 is connected to one end of the resistor 84-12 at the node N12. At the gate of transistor 84-8, the voltage $V_{ref}$ is provided. The other end of the current path of the MOS transistor 84-9 makes a common connection with the other end of the current path through the MOS transistor 84-8 at the node 12. At the gate of transistor 84-9, the node N14 is connected.

In this configuration, the MOS transistors 84-8 and 84-9 have the same size. Namely, the current driving forces of the MOS transistors 84-8 and 84-9 are the same. Also, because the electric potential of the node N12 is commonly applied to the MOS transistors 84-8 and 84-9, there are equal electric potential differences $V_{gs}$ (gate-source potential) between the node N12, and the gate of MOS transistors 84-8, on one hand, and 84-9, on the other. Namely, the electric potential at the gate of the MOS transistor 84-9 (the electric potential at the node N14) is $V_{ref}$. Also, one end of the resistor 84-12 is connected to the node N12, and the other end is grounded.

At one end of the current path of the MOS transistor 84-3, the voltage VSUP is provided. The node N13 is connected to the other end of the current path and the gate of the MOS transistor 84-3, the node N13 is connected. At one end of the current path of the MOS transistor 84-4, the voltage VSUP is provided, and the other end is connected to the node N15. The gate of transistor 84-4 is connected to the gate of the MOS transistor 84-3 at the node N13. Here, the MOS transistors 84-1 through 84-4 have the same transistor sizes.

Also, one end of the current path of the MOS transistor 84-7 is connected to the node N13, and the other end is connected to the node N14. The gate of the MOS transistor 84-7 is connected to the node N11.

Furthermore, one end of the resistor 84-13 is connected to the node N14, and the other end is grounded. The resistance of this resistor 84-13 is denoted as $R_{ref}$. Namely, since the electric potential at the node N14 is $V_{ref}$, the current flowing at the node N14 is $V_{ref}/R_{ref}$. In the following, the current flowing at the node N14 is denoted as $I_{ref}(=V_{ref}/R_{ref})$.

Furthermore, one end of the current path and the gate of the MOS transistor 84-10 are connected to the node N15, and the other end is grounded. One end of the current path of the MOS transistor 84-11 is connected to the node N2, and the gate of the MOS transistor 84-11 makes a common connection with the gate of the MOS transistor 84-10 at the node N15, and the other end is grounded. Here, the electric potential of the node N15 is the same as that of the node N13. It is because the current that the MOS transistors 84-3 and 84-4 apply to the node N13 corresponds to the electric potential that has increased to the point just before the MOS transistors 84-3 and 84-4 are put into OFF state. Since this current flows into the node N15, the voltage applied to the gates of the MOS transistors 84-10 and 84-11 takes the same value as the node N13. This means that to the MOS transistor 84-11, $I_{ref}(=V_{ref}/R_{ref})$ flows.

5-2 Construction of the $I_{ref}$ Generator 85 (No. 2)

Next, the construction of the second $I_{ref}$ generator 85 will be explained, using FIG. 7. As shown in FIG. 7, the $I_{ref}$ generator 85 has an operational amplifier 85-1, p-channel type MOS transistors 85-2 and 85-3, a resistor 85-4, and n-channel MOS transistors 85-5 and 85-6. To one end of the current path of the MOS transistor 85-2, the voltage VSUP is provided, and the other end is connected to the node N20. To the gate of the MOS transistor 85-2, power output from the operational amplifier 85-1 is provided. The electric potential of this node N20 is denoted as voltage $V_{mon}$. One end of the resistor 85-4 is connected to this node N20, and the other end is grounded. The resistance value of this resistor 85-4 is denoted as $R_{ref}$. The operational amplifier 85-1 operates to equalize the voltage $V_{mon}$ of the node N20 with the voltage $V_{ref}$.

At one end of the current path of the MOS transistor 85-3, the voltage VSUP is provided. The other end of the current path is connected to the node N21. At the gate of the MOS transistor 85-3, the output of the operational amplifier 85-1 is provided. One end of the current path of the MOS transistor 85-5 and the gate of this transistor are connected to the node N21, and the other end of the current path is grounded. One end of the current path of the MOS transistor 85-6 is connected to the node N2, while the gate of the transistor is connected to the node N21, and the other end of the current path is grounded. Here, the current that flows through the MOS transistor 85-6 is denoted as $I_{ref}$.

The current $I_{ref}$ that flows through the MOS transistor 85-6 will be explained. First, when the voltage $V_{mon}$ of the node N20 is set so as to equal the voltage $V_{ref}$, a current equal to the $I_{ref}=V_{ref}/R_{ref}$ flows across the resistor 85-4. Also, as mentioned above, the gates of the MOS transistors 85-2 and 85-3 are connected. Thus, MOS transistors 85-2 and 85-3 form a Miller circuit. Consequently, a current equal to $I_{ref}$, which flows through resistor 85-4, flows through the MOS transistor 85-3 also.

Also, the gates of the MOS transistors 85-5 and 85-6 are connected. Therefore, the currents that flow to the MOS transistors 85-5 and 85-6 through the Miller circuit are the same. Also, because the MOS transistor 85-5 and the MOS transistor 85-3 are connected in series, the current that flows through the MOS transistor 85-3 is the same as the current which flows through MOS transistor 85-5. This current is $I_{ref}$. For these reasons, $I_{ref}$ flows through the MOS transistor 85-6, where $I_{ref}$ equals $V_{ref}/R_{ref}$.

5-3 Configuration of the $I_{ref}$ Generator 86 (No. 3)

Next, the construction of the third $I_{ref}$ generator 86 will be explained, using FIG. 8. As shown in FIG. 8, the configuration of the third $I_{ref}$ generator 86 differs from the previously described Ire generator 85 in that it has additional p-channel type MOS transistors 86-4 and 86-5. Other than that, the construction is the same as that of the previously described $I_{ref}$ generator 85. Therefore, we will omit portions of the explanation that would be repetitive.

Figure 8:
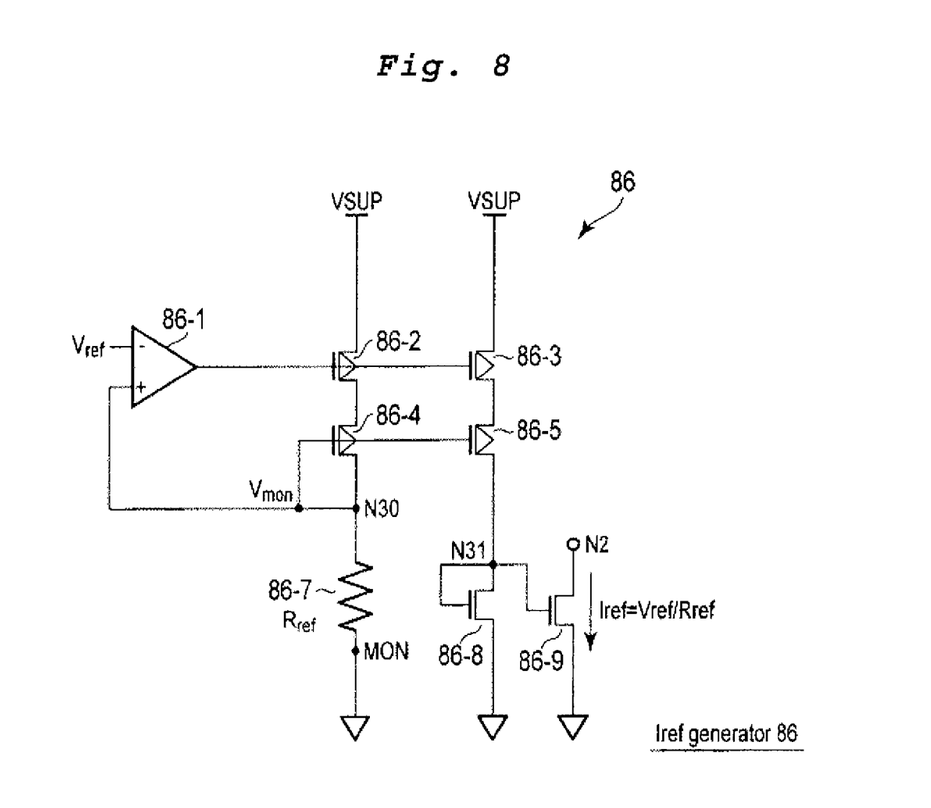
FIG. 8 is a circuit diagram of the reference current generator of the first embodiment.

As shown in FIG. 8, a first end of the current path through the MOS transistor 86-4 is connected to the other end of the current path of the MOS transistor 86-2. The second end of the current path through the MOS transistor 86-4 and its gate connected to the node N30. The electric potential of node N30 is denoted as $V_{mon}$. Also, a first end of the current path through the MOS transistor 86-5 is connected to the other end of the MOS transistor 86-3. The second end of the current path through transistor 86-5 is connected to the node N31, and its gate is connected to the node N30 ($V_{mon}$). This means that the gates of the MOS transistor 86-4 and the MOS transistor 86-5 are connected, and turn ON/OFF according to the electric potential level of $V_{mon}$.

6. On Output Voltage of the Voltage Generator Circuit 71-2

Next, the voltage that the voltage generator circuit 71-2 generates will be quantitatively explained.

As explained in FIG. 5, the voltage generator circuit 71-2 receives the voltage $V_{SL}$ and generates the voltage $V_{USL}$. Here, because $V_{SL}$, which the voltage generator circuit 71-1 generates, has a temperature coefficient, it will be expressed as $V_{SL}$ (T) in the following.

As clearly seen in FIG. 5, the operational amplifier 80 operates to adjust voltage $V_{mon}$ of the node N2 so that it is equal to $V_{SL}$ (T). This means that the electric potential of the node N2 is $V_{SL}$(T). Also, the voltage drop across the variable resistor is expressed as $R_{dac}*I_{ref}$. Therefore, the voltage $V_{USL}$ is expressed as $V_{SL}$ (T)+$R_{dac}*I_{ref}$.

Here, as described above, the $I_{ref}$ generator 84 (or, alternatively, 85 and 86) generates a current, which is $I_{ref}=V_{ref}/R_{ref}$; therefore, the value of $V_{USL}$ is $V_{SL}$ (T)+$R_{dac}*V_{ref}/R_{ref}$.

This means that using $V_{SL}$ (T) as a standard, the voltage shift provided by the voltage generator circuit 71-2 ($V_{USL}-V_{SL}$) is $R_{dac}*V_{ref}/R_{ref}$. Because of $R_{dac}$ and $R_{ref}$ even if the voltage values are different, a resistance component can be cancelled out. In short, thermally dependent components are removed from the level-shifted voltage by eliminating the resistance component per unit length, i.e., the sheet resistance.

This will be explained more concretely in the following. The resistance of the variable resistor 83 is $R_{dac}=R_0(1+kT)$, and $R_{ref}=R_{ref0}(1+kT)$, where k is a constant determined by the resistor material, T is the absolute temperature, and $R_0$ is the resistance value of $R_{dac}$ at 0° C.

These values are substituted into the voltage shift expression ($R_{dac}*V_{ref}/R_{ref}$) to obtain $R_0(1+kT)*V_{ref}/R_{ref0}(1+kT)$, i.e., $R_0*V_{ref}/R_{ref0}$. In this way, by cancelling "T" out, it can be seen that the level-shifted voltage has a value that is not thermally dependent.

Effect of the Embodiment

According to the semiconductor memory of this embodiment, it is possible to make the voltage shift less dependent on thermal effects, and to provide the unselected source line SL with an appropriate voltage. This situation concretely will be explained, using FIG. 9.

Figure 9:
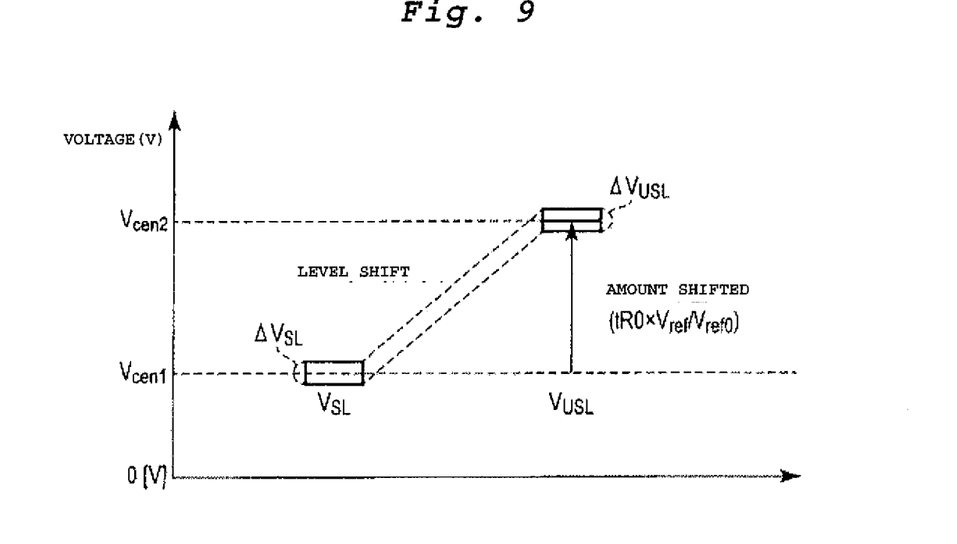
FIG. 9 is a conceptual map of the voltage, level-shifted by the voltage-generator circuit of the first embodiment.

FIG. 9 shows the situation in which there is a level shift of the voltage $V_{SL}$, which the voltage generator circuit 71-1 generates in the process of providing the voltage $V_{USL}$ for the unselected source line SL. The vertical axis shows the amount of voltage. The horizontal axis shows the values of the voltage $V_{SL}$ and the voltage $V_{USL}$. As shown in FIG. 9, the central voltage of the voltage $V_{SL}$ is expressed as $V_{cen1}$ (meaning $V_{SL}$ (T)), and the voltage range that this $V_{cen1}$ can take is expressed as $\Delta V_{SL}$. When the central voltage $V_{cen2}$ of the voltage $V_{USL}$, which is obtained when this $V_{cen1}$ is level-shifted, is viewed from $V_{cen1}$, its electrical potential difference is expressed as ($R_0*V_{ref}/R_{ref0}$). As described above, because within the voltage $V_{USL}$, ($R_0*V_{ref}/R_{ref0}$) has less dependence on thermal effects, the voltage range that $V_{cen2}$, which is a central voltage, can take will be $\Delta V_{USL}=\Delta V_{SL}$.

If there is a dependence of temperature in voltages other than $V_{SL}$ (T) when a level-shift takes place, the voltage range $\Delta V_{USL}$ from the central voltage $V_{cen2}$ fluctuates significantly according to the temperature. According to the semiconductor memory of this embodiment, these significant fluctuations can be suppressed.

Also, according to the semiconductor memory of this embodiment, the circuit area can be reduced. For the purposes of illustration, when the level-shift of $V_{SL}$(T) is attempted in the devices described above, due to the fact that the dependence of temperature influences the level shift in these devices, it is difficult to provide the unselected source line SL with an appropriate voltage. With these devices, if there is an attempt to generate the voltage $V_{USL}$ at the same precision as the voltage generator circuit 71-1, or to provide appropriate voltage to the source line, then the circuit scale of the voltage generator circuit 71-2 must be larger. In fact, the circuit area of the voltage generator circuit 71-2 will need to be as large as that of the voltage generator circuit 71-1.

On the other hand, according to the semiconductor memory of this embodiment, because ($R_0*V_{ref}/R_{ref0}$) within the voltage $V_{USL}$ has less dependence on thermal effects, it is not necessary to use a voltage generator circuit 71-2 of size similar to the voltage generator circuit 71-1. As clearly shown in FIG. 5 through FIG. 8, it is possible to reduce the circuit area due to the fact that fewer circuit elements are necessary. As a result, as compared to the voltage generator circuit 71-2, it is possible for the size of the circuit to be approximately 85% smaller.

The First Variation Example

Figure 10:
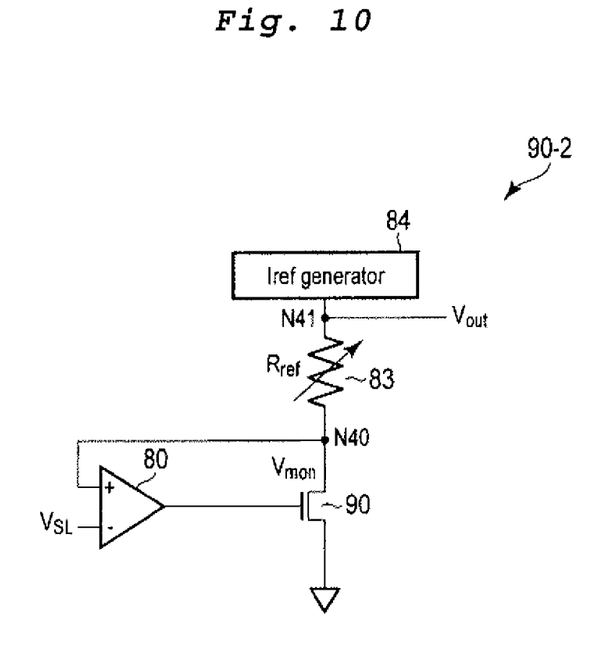
FIG. 10 is a circuit diagram of a first variation example of the voltage-generator circuit of the first embodiment.
Figure 11:
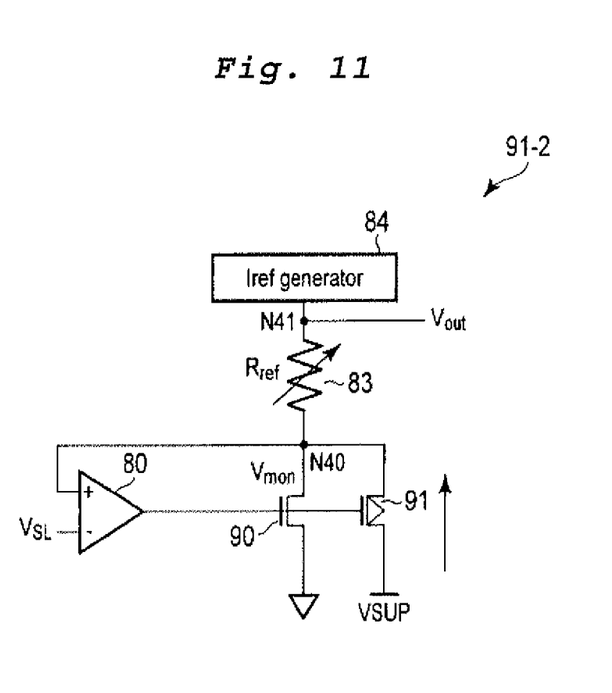
FIG. 11 is a circuit diagram of a second variation example of the voltage-generator circuit of the first embodiment.

Next, the semiconductor memory regarding the first variation example of the first embodiment will be explained in the following, using FIG. 10. Here, another construction example of the voltage generator circuit 71-2 explained above will be explained, but the same notations for the same construction will be used. In the following, a voltage generator circuit which generates the voltage $V_{USL}$ will be denoted as the voltage generator circuit 90-2. As shown in FIG. 11, the voltage generator circuit 90-2 has a n-channel type MOS transistor 90, an operational amplifier 80, a variable resistor 83, and an $I_{ref}$ generator 84.

One end of the current path of the MOS transistor 90 is connected to the node N 40. To the gate, power output of the operational amplifier 80 is provided. The other end is grounded. The operational amplifier 80 uses the electric potential of the node N40 and $V_{SL}$ as an input electrical potential, and compares these voltages. Here, the electric potential of the node N40 is denoted as $V_{mon}$. Then, the operational amplifier 80 operates to equalize the voltage $V_{mon}$ with the voltage $V_{SL}$.

To this node N40, one end of the variable resistor 83 is connected. The other end is connected to the node N41. The resistance value of this variable resistor 83 is also denoted as $R_{dac}$. The node N41 is designated as the output terminal, which outputs $V_{USL}$. Next, the output terminal of the $I_{ref}$ generation is connected to the node N41.

This means that $I_{ref}$ will flow to the variable resistor 83, same as described above. For this reason, the voltage of the node N41 $V_{USL}$ will be $V_{mon}+R_{dac}*I_{ref}$. Here, $(V_{mon}+R_{dac}*I_{ref})$ is a value that has no dependence of temperature.

Also, in this first example of the variations, it is possible to obtain the same effect as the first embodiment described above. In other words, it is possible for the construction of the first variation example to provide the unselected source line SL with an appropriate voltage without letting the level-shifted voltage have dependence of temperature, and to reduce the scale of the circuit.

The Second Variation Example

Next, the semiconductor memory regarding a second variation example of the first embodiment will be explained, using FIG. 11. Here also, another configuration of the voltage generator circuit 71-2 will be explained, but the same notations for previously-mentioned components will be used. Also, we will omit the discussion of previously-described components of the voltage generator circuit 90-2. In the following, a voltage generator circuit which generates the voltage $V_{USL}$ is called the voltage generator circuit 91-2. As shown in FIG. 11, the voltage generator circuit 91-2 is different from the voltage generator circuit 90-2 in that it has an additional n-channel type MOS transistor 91.

As shown in FIG. 11, one end of the current path of the MOS transistor 91 is connected to the node N40. At the other end, the voltage VSUP is provided. At the gate, the output voltage of the operational amplifier 80 is provided. In brief, by putting the MOS transistor 90 into the ON or OFF state through the signals outputted from the operational amplifier 80, the voltage of the node N40 $V_{mon}$ is brought closer to the voltage $V_{ref}$. But in addition to this MOS transistor 90, by adding the current from the MOS transistor 91 to the node N 40, the voltage $V_{mon}$ of the node N 40 is brought even closer to the voltage $V_{ref}$. Because of this, it is possible to output the voltage $V_{USL}$ so that the voltage is even more stable than the voltage generated by voltage generator circuit 90-2.

Also, in this second variation example, it is possible to obtain the same effect as the first embodiment. In other words, using the second variation example, it is also possible to provide the unselected source line SL with an appropriate voltage without letting level-shifted voltages have dependence of temperature, and to reduce the circuit size.

The Third Variation Example

Next, the semiconductor memory regarding a third variation example of the first embodiment will be explained, using FIG. 12. Here also, another example of the voltage generator circuit 71-2 explained above will be explained. Also, a voltage generator circuit which generates $V_{USL}$ shown here will be called the voltage generator circuit 93-2, while the same notations will be used for common components previously-mentioned above.

Figure 12:
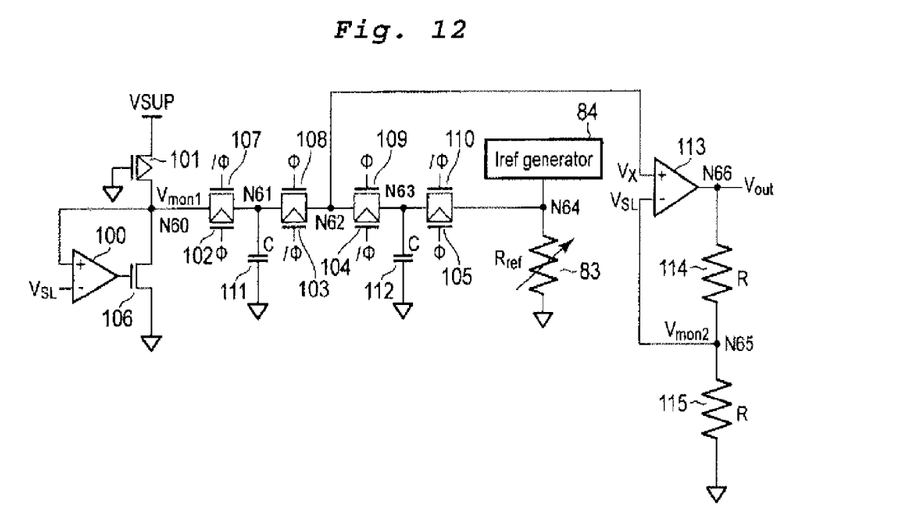
FIG. 12 is a circuit diagram of a third variation example of the voltage-generator circuit of the first embodiment.

As shown in FIG. 12, the voltage generator circuit 93-2 has operational amplifiers 100 and 113, p-channel type MOS transistors 101 through 105, n-channel type MOS transistors 106 through 110, and capacitors 111 and 112, an $I_{ref}$ generator 84, a variable resistor 83, and resistors 114 and 115. As shown in FIG. 12, at one end of the current path of the MOS transistor 101, the voltage VSUP is provided. The gate is grounded and the other end of the current path is connected to the node N60. This means that the MOS transistor 101 is permanently in ON state, and current constantly flows at the node N60. One end of the current path of the MOS transistor 106 makes a common connection with the other end of the MOS transistor 101 at the node N60. At the gate of MOS transistor 106, the output of the operational amplifier 100 is provided, and the other end of the current path is grounded. Here, the electric potential of the node N60 is denoted as $V_{mon1}$. The operational amplifier 100 operates to compare the voltage $V_{mon1}$ with the voltage $V_{SL}$, and to equalize this voltage $V_{mon1}$ with the voltage $V_{SL}$. When $V_{mon1}>V_{SL}$, the operational amplifier 80 brings the electric potential of the node N60 closer to the electric potential to the ground potential, by outputting the "H"-level signal and putting the MOS transistor 106 into ON state. On the other hand, when $V_{mon1}<V_{SL}$, the operational amplifier 80 puts the MOS transistor 106 into OFF state, by outputting the "L"-level signal. As mentioned above, the MOS transistor 101 is permanently in ON state, so the electric potential of the node N60 ($V_{mon1}$) is charged, and the voltage $V_{mon1}$ becomes closer to the voltage $V_{SL}$.

One end of the current path of the MOS transistor 107 is connected to the node N60. To the gate, the control signal /ϕ (where "/" indicates a reverse signal) is provided, and the other end is connected to node N61. One end of the current path of the MOS transistor 102 makes a common connection with one end of the MOS transistor 101 at the node 60. To the gate, the control signal ϕ is provided, and the other end makes a common connection with the MOS transistor 103 at the node N61. This means that the MOS transistors 102 and 107 form a switch element SW1. Then, corresponding to this switch element SW1, the node N60 and the node N61 are put into either short-circuit or open state. One pole of the capacitor 111 is connected to the node N61, and the other pole is grounded. Here, the capacitance of the capacitor 111 is denoted as C.

One end of the current path of the MOS transistor 108 is connected to the node N61. At the gate, the control signal ϕ is provided. The other end is connected to the node 62. One end of the current path of the MOS transistor 103 makes a common connection with one end of the MOS transistor 108 at the node N61. To the gate, the control signal /ϕ is provided. The other end makes a common connection with the other end of the MOS transistor 108 at the node N62. This means that the MOS transistors 103 and 108 form a switch element SW2. Then, according to this switch element SW2, the node N61 and the node N62 are put into either short-circuit or open state. Here, the electric potential of the node N62 is denoted as the voltage Vx.

One end of the current path of the MOS transistor 109 is connected to the node N62. To the gate, the control signal φ is provided, and the other end is connected to the node N63. One end of the current path of the MOS transistor 104 makes a common connection with the MOS transistor 109 at the node 62. At the gate, the control signal /φ is provided. The other end of the current path is connected to the other end of the MOS transistor 109 at the node N63. In this way, the MOS transistors 104 and 109 form a switch element SW3. Then, according to the switch element SW3, the node N62 and the node N63 are put into either short-circuit or open state. One end of the capacitor 112 is connected to the node N63, and the other end is grounded. Here, the capacitance of the capacitor 112 is denoted as C.

One end of the current path of the MOS transistor 110 is connected to the node N63. At the gate, the control signal /φ is provided. The other end of the current path is connected to the node N64. One end of the current path of the MOS transistor 105 makes a common connection with one end of the MOS transistor 110 at the node N63. To the gate, the control signal 9 is provided. The other end makes a common connection with the other end of the MOS transistor 110 at the node N64. This means that the MOS transistors 105 and 110 form a switch element SW4. Then, according to this switch element SW4, the node N63 and the node N64 are put into either short-circuit or open state.

The output terminal of the $I_{ref}$ generator 84 is connected to the node N64. Also, one end of the variable resistor 83 is connected to this node N64. The other end is grounded. This means that $I_{ref}$, which the $I_{ref}$ generator 84 outputs, flows into the variable resistor 83. The electric potential of the node N64 is expressed as $R_{dac}*I_{ref}$. Here, as described above, the resistance value of the variable resistor 83 is expressed as $R_{dac}$ (=RO (1+kT))

The operational amplifier 113 uses the voltage Vx at the node N62 and the electric potential of the node N65 as input voltages, and operates to compare and equalize the voltage Vx with the electric potential of the node N65. Here, the electric potential at the node N65 is expressed as the voltage $V_{mon2}$. The operational amplifier 113 operates to equalize the voltage Vx with the voltage $V_{mon2}$.

When $V_{mon2}$>Vx, the operational amplifier 113 decreases the output electric potential to the node N 66 so that the voltage $V_{mon2}$ becomes closer to the voltage Vx. On the other hand, when $V_{mon2}$<Vx, the operational amplifier 113 increases the output electric potential to the node N66 so that the voltage $V_{mon2}$ becomes closer to the voltage Vx. This output electric potential is the voltage $V_{USL}$.

One end of the resistor 114 is connected to the node N66, and the other end is connected to the node N65. One end of the resistor 115 makes a common connection with the other end of the resistor 114 at the node N65, and the other end is grounded.

Here, the signal level ("H" or "L") and the timing of the control signals φ, /φ are controlled by the control area 7.

<Operation of the Voltage Generator Circuit 93-2>

Next, the operation of the voltage generator circuit 93-2 will be explained using FIG. 12.

Step 1: The operational amplifier 100 controls ON/OFF state of the MOS transistor 106 through the voltage $V_{mon1}$. Also, as mentioned above, since the MOS transistor 101 is permanently in the ON state, the voltage $V_{mon1}$ of the node N60 is the voltage $V_{SL}$. Also, as a result of the current provided by the $I_{ref}$ generator 84, the electric potential of the node N64 is $R_{dac}*I_{ref}$.

Step 2: In the state described in Step 1, φ is at the "L" level. This means that the switch element SW1 is in the ON state. This means that the node N60 and the node N61 are conductively connected and the electric potential of the node N60 causes charging of the capacitor 111. Also, the switch element SW4 is in the ON state, and the node N63 and the node N64 are conductively connected. Consequently, the electric potential of the node N64 causes charging of the capacitor 112. There, the operational amplifier 100 tries to maintain the electric potential of the node N60 at $V_{SL}$ and increases the current driving force of the MOS transistor 106. Also, since $I_{ref}$, which the $I_{ref}$ generator 84 outputs, is a constant current, the node N64 has a constant voltage.

Step 3: After the capacitor 111 is charged by the voltage $V_{SL}$ and the capacitor 112 is charged to have a voltage equal to $R_{dac}*I_{ref}$, the control signal φ is "H."

This means that the switch elements SW1 and SW4 are in OFF state, and that the switch elements SW2 and SW3 are in ON state. So, the node N61 and the node N62 are short circuited, and the voltage that has been charged at the capacitor 111 is transferred to the node N62.

In the same manner, the node N62 and the node N63 are short circuited, and the electric potential of the node N63 is transferred to the node N62. Here, since the capacitors 111 and 112 are connected in series, and share charge, the electric potential of the node N62 is $(V_{SL}+R_{dac}*I_{ref})/2$.

Step 4: The operational amplifier 113 operates to equalize the voltage Vx of the node N62, which is inputted to the positive input terminal. The voltage $V_{mon2}$ is inputted to the negative terminal. Here, since the resistance values of the resistors 114 and 115 are the same, the electric potential of the node N66 has twice the voltage as the node N65, i.e., $(V_{SL}+R_{dac}*I_{ref})$.

For these reasons, since $I_{ref}=V_{ref}/R_{ref}$ here as well, the voltage $V_{USL}$, which is provided to the unselected source line SL (and is labeled as Vout at node N66) is a value independent of temperature. Therefore, it is possible to provide the unselected source line SL with an appropriate voltage without letting the level-shifted voltage be affected by thermal variability.

Embodiment 2

Figure 13:
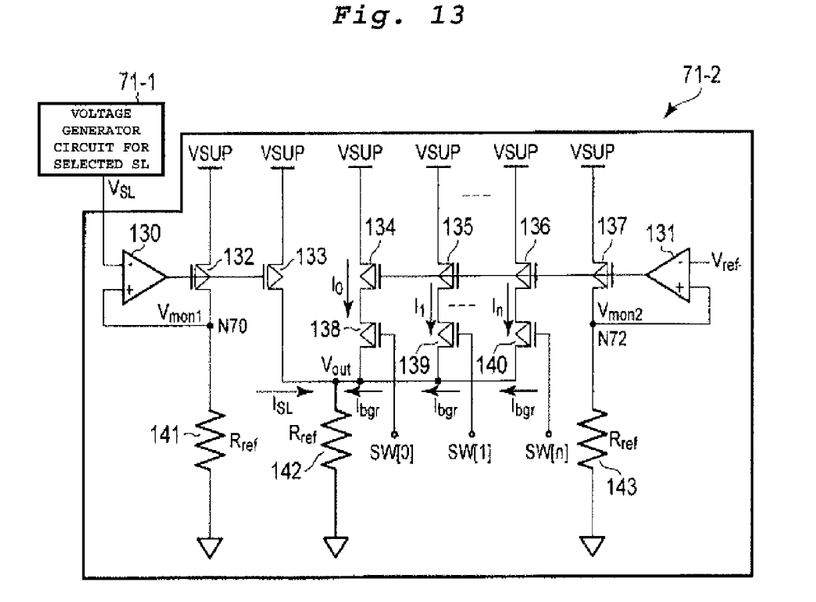
FIG. 13 is a circuit diagram of a voltage-generator circuit according to a second embodiment.

Next, the semiconductor memory regarding the second embodiment will be explained using FIG. 13. In this embodiment, another example of the voltage generator circuit 71-2 for the unselected source line, described above is shown. As shown in FIG. 13, the voltage generator circuit 71-2 has operational amplifiers 130 and 131, p-channel type MOS transistors 132 through 140, and resistors 141 through 143. To one end of the current path of the MOS transistor 132, the voltage VSUP is provided, and the other end is connected to the node N70. To the gate, output power from the operational amplifier 130 is provided. The electric potential of the node N70 is $V_{mon1}$. Also, one end of the resistor 141 is connected to this node N70 and the other end is grounded.

The operational amplifier 130 compares the voltage $V_{SL}$ with the electric potential of the node N70 ($V_{mon1}$), and provide the gate of the MOS transistor 132 with the comparison result. When $V_{SL}$>$V_{mon1}$, the operational amplifier 130 outputs the "L" level signal, and put the MOS transistor 132 into ON state.

On the other hand, when $V_{SL}$<$V_{mon1}$, it brings this voltage $V_{mon1}$ closer to the voltage $V_{SL}$ by outputting the "H" level signal and putting the transistor 132 into OFF state, which decreases the voltage $V_{mon1}$. Here, as mentioned above, the voltage $V_{SL}$ is provided by the voltage generator circuit 71-1.

To one end of the current path of the MOS transistor 133, the voltage VSUP is provided, and the other end is connected to the node N71. To the gate, output power from the operational amplifier 130 is provided. Here the current which the MOS transistor 133 applies to the node N71 is denoted as I SL. One end of the resistor 142 is connected to this node N71, and the other end is grounded.

Also, to one end of the current path of the MOS transistor 137, the voltage VSUP is provided. The other end is connected to the node N72. To the gate, output power from the operational amplifier 131 is provided. The electric potential of this node 72 is $V_{mon2}$. The operational amplifier 131 compares this voltage $V_{mon2}$ with the voltage $V_{ref}$, and provides the gates of the MOS transistors 134 through 137 with this comparison result. And if $V_{ref} > V_{mon2}$, the operational amplifier 131 outputs the "L" level signal and puts the MOS transistor 137 into ON state. On the other hand, if $V_{ref} < V_{mon2}$, it brings this voltage $V_{mon2}$ closer to the voltage $V_{SL}$, by outputting the "H" level signal and putting the MOS transistor 137 into OFF state, which decreases the voltage $V_{mon}$. In this way, the operational amplifier 131 controls ON/OFF state of the MOS transistors 134 through 136, in addition to 137. Here, the MOS transistors 134 through 136 are mentioned as MOS transistors controlled by the operational amplifier 131. In actuality, however, n-MOS transistors will be installed. In other words, the MOS transistor 136 is the n-th transistor from the MOS transistor 134. Also, one end of the resistor 143 is connected to the node N72, and the other end is grounded.

To each one end of the current paths of the MOS transistors 134 through 136, the voltage VSUP is provided, and each of the other ends is connected to its corresponding end of the current paths of the MOS transistors 138 through 140. To each gate, output power from the operational amplifier 131 is provided. Each of the other ends of the MOS transistors 138 through 140 is connected to the node N71. To the gate, a signal SSW [n] is provided. For example, when the signal SW[n] is at the "L" level, the MOS transistor 140 is in ON state, and there will be a current flow toward the node N71. Here, the current that flows in the MOS transistor 136 and 140 is denoted as In. This also applies to the MOS transistor 138 and the MOS transistor 139. This means that when the signal SW [1] is at the "L" level, the MOS transistor 139 is put into ON state, and there will be a current flow toward the node N71. Here, the current that flows in the MOS transistors 135 and 139 is denoted as I 1. Also, when the signal SW [0] is at the "L" level, the MOS transistor 138 is in ON state, and there will be a current flow toward the node N71. Here, the current that flows in the MOS transistors 134 and 138 is denoted as I 0.

The sum of the current values of I 0 through I n is denoted as I bgr. This I bgr and the current $I_{SL}$ flow into the node 71. A resistor 142 is installed between this node N71 and the ground potential. Here, the resistance value of the resistor 142 is denoted as $R_{ref}$. Then, the electric potential of the node N71 V out is expressed in the equation (1), shown below.

$$V_{out} = (I_{SL} + I_{bgr}) \times R_{ref} \quad (1)$$

Here, since the current flowing in the node N71 is $V_{SL}/R_{ref}$ and I 0 through In have the same value of the current flowing in the node N72 ($V_{ref}/R_{ref}$), Equation (1) can be substituted with Equation (2) below.

$$V_{out} = (V_{SL}/R_{ref} + SW[0] \times V_{ref}/R_{ref} + SW[1] \times V_{ref}/R_{ref} + \ldots + SW[n] \times V_{ref}/R_{ref}) \times R_{ref} \quad (2)$$

Here, if SW [0] through SW[n] are at the "L" level, the current corresponding to each of these SW [0] through SW [n] will flow in the node N71.

From Equation (2), Equation (3), shown below, is obtained $$V_{out} = (V_{SL}/R_{ref} + SW[0] \times V_{ref} + SW[1] \times V_{ref} + \ldots + SW[n] \times V_{ref} \quad (3)$$

From this reason, the voltage $(SW[0] \times V_{ref} + SW[1] \times V_{ref} + \ldots + SW[n] \times V_{ref})$, level-shifted by the voltage generator circuit 71-2 based on the input voltage ($V_{SL}$ from the voltage generator circuit 71-1), is a voltage without temperature dependence.

The Effects in Regard to this Embodiment

The semiconductor memory in regard to this embodiment, as can be done in the first embodiment, can also provide the unselected source line SL with an appropriate voltage without letting a level-shifted voltage bear the dependence of temperature. It is because the voltage generator circuit 71-2 can generate a stable voltage without depending on temperature, due to the fact that it has no resistance components, made clear in the level-shifted voltage components, While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory having a voltage generator, the voltage generator comprising:
   a first comparison device configured to have a first voltage input thereto, compare the first voltage with a second voltage at a first node, and to output a comparison result that causes the second voltage at the first node to be equal to the first voltage;
   a first capacitor connected between ground and a second node;
   a first switch configured to electrically connect and disconnect the first and second nodes;
   a current source configured to output a current to a third node;
   a first resistor connected between ground and the third node;
   a second capacitor connected between ground and a fourth node;
   a second switch configured to electrically connect and disconnect the third and fourth nodes;
   a third switch configured to electrically connect and disconnect the second node and a fifth node, and a fourth switch configured to electrically connect and disconnect the fourth node and the fifth node; and
   a second comparison device configured to have a third voltage input thereto, compare the third voltage with a fourth voltage, and to output an output voltage, wherein the third voltage is a voltage at the fifth node and the fourth voltage is a percentage of the output voltage.

2. The semiconductor memory of claim 1, further comprising a transistor having a gate to which the comparison result of the first comparison device is supplied.

3. The semiconductor memory of claim 2, wherein the transistor turns ON when the second voltage is higher than the first voltage, and turns OFF when the second voltage is lower than the first voltage.

4. The semiconductor memory of claim 3, wherein the transistor is an n-channel type MOS transistor.

5. The semiconductor memory of claim 1, wherein the current source comprises:
- a third comparison device configured to compare a reference voltage with a fourth voltage input thereto, and output a third comparison device output voltage that affects the fourth voltage;
- a transistor configured to be turned ON or OFF by the third comparison device output voltage;
- a resistor; and
- a miller circuit having a group of transistors and configured to generate a current through one of the transistors,
- wherein the current generated through one of the transistors is the current that is output to the third node.

6. A voltage generator for a semiconductor memory, comprising:
- a transistor between a first node and ground;
- a first operational amplifier having a first input to which a reference voltage is supplied, a second input connected to the first node, and an output connected to a gate of the transistor;
- a first capacitor connected between ground and a second node;
- a first switch arranged between the first and second nodes to electrically connect and disconnect the first and second nodes;
- a current source connected to a third node to supply a current to the third node;
- a first resistor connected between ground and the third node;
- a second capacitor connected between ground and a fourth node;
- a second switch arranged between the third and fourth nodes to electrically connect and disconnect the third and fourth nodes;
- a third switch arranged between the second node and a fifth node to electrically connect and disconnect the first and fifth nodes;
- a fourth switch arranged between the fourth and fifth nodes to electrically connect and disconnect the fourth and fifth nodes; and
- a second operational amplifier having a first input connected to the fifth node, a second input connected to a sixth node, and an output through which an output voltage of the voltage generator is supplied, the output of the second operational amplifier being connected to the sixth node through a second resistor.

* * * * *